(12) United States Patent
Hynecek

(10) Patent No.: US 6,882,022 B2
(45) Date of Patent: Apr. 19, 2005

(54) DUAL GATE BCMD PIXEL SUITABLE FOR HIGH PERFORMANCE CMOS IMAGE SENSOR ARRAYS

(75) Inventor: Jaroslav Hynecek, Allen, TX (US)

(73) Assignee: Isetex, Inc, Allen, TX (US)

(*) Notice: Subject to any disclaimer, the term of this patent is extended or adjusted under 35 U.S.C. 154(b) by 0 days.

(21) Appl. No.: 10/654,451

(22) Filed: Sep. 4, 2003

(65) Prior Publication Data

US 2005/0051808 A1 Mar. 10, 2005

(51) Int. Cl.[7] .............................................. H01L 31/06
(52) U.S. Cl. ................................... 257/461; 257/4
(58) Field of Search .......................... 257/4–5, 461

(56) References Cited

U.S. PATENT DOCUMENTS

| | | | |
|---|---|---|---|
| 4,556,909 A | * 12/1985 | Yamada | 348/307 |
| 5,317,174 A | * 5/1994 | Hynecek | 257/222 |
| 5,341,008 A | * 8/1994 | Hynecek | 257/231 |
| 5,625,210 A | * 4/1997 | Lee et al. | 257/292 |

* cited by examiner

Primary Examiner—Allan R. Wilson
(74) Attorney, Agent, or Firm—John E. Vandigriff

(57) ABSTRACT

A Dual Gate BCMD pixel has a compact size, nondestructive readout; complete reset with no kTC-reset noise generation, anti-blooming protection, and column reset capability. By incorporating a dual gate MOS transistor with an enclosed annular layout into the pixels of image sensing array, and sensing photo-generated charge nondestructively by detecting the transistor threshold voltage variations caused by collected charge, achieves this goal and other objects of the invention.

16 Claims, 5 Drawing Sheets

# DUAL GATE BCMD PIXEL SUITABLE FOR HIGH PERFORMANCE CMOS IMAGE SENSOR ARRAYS

FIELD OF INVENTION

The present invention relates to solid-state image sensors, specifically to CMOS image sensors that have high sensitivity, low noise, complete charge removal without kTC noise generation, and use column reset to achieve high Dynamic Range (DR).

BACKGROUND OF THE INVENTION

Description of Related Art

A typical image sensor senses light by converting impinging photons into electrons that are integrated (collected) in sensor pixels. After completion of integration cycle, charge is converted into a voltage that is supplied to output terminals of the sensor. In CMOS image sensors, the charge to voltage conversion is accomplished directly in the pixels themselves, and the analog pixel voltage is transferred to the output terminals through various pixel addressing and scanning schemes. The pixels have incorporated in them a buffer amplifier, typically a source follower, which drives the sense lines that are connected to the pixels by suitable addressing transistors. After charge to voltage conversion is completed, and the resulting signal transferred out from the pixel array, the pixels are reset in order to be ready for accumulation of new charge. In pixels that are using Floating Diffusion (FD) as the charge detection node, the reset is accomplished by turning on a reset transistor that momentarily conductively connects the FD node to a voltage reference. This step removes collected charge, however, it generates kTC-reset noise as is well known in the art. kTC noise has to be removed from the signal by a complicated Correlated Double Sampling (CDS) signal processing technique in order to achieve a desired low noise performance. For this reason, another class of photo sensing devices and detection nodes have been developed that collect charge in a potential well instead of on a diffusion. These devices are reset by completely transferring collected charge out of the well without leaving any residue. This process thus does not generate kTC noise, therefore, the processing of signals from such pixels is faster and simpler. An example of kTC noise free pixel design can be found in U.S. Pat. No. 6,545,331 B1 to Miida, in U.S. Pat. No. 5,424,223, and U.S. Pat. No. 6,580,106 B2 both to Hynecek. The pixel photo detector described in U.S. Pat. No. 5,424,223 is called the Bulk Charge Modulated Device (BCMD), since collected charge modulates the threshold voltage of a sensing MOS transistor. The advantage of using BCMD devices for charge detection in CMOS image sensors is in their low noise and small size since a single transistor serves there in a charge-to-voltage conversion, the pixel addressing, and signal buffering functions. The disadvantage of using the BCMD devices, on the other hand, is a possibility of interference and cross talk of pixels connected to a common column line. The disadvantage is also the fact that, for an improved performance, the BCMD pixel needs to include a pinned photodiode to achieve high Quantum Efficiency (QE). The pixel also needs to include anti-blooming drain for taking care of charge overflow and charge removal during reset. Adding all of these structures consumes the pixel area and prevents designing of image sensors with very small pixel sizes. Finally, the last disadvantage of the BCMD pixel is in its difficulty to incorporate column reset. The column reset is an important feature for building image sensors with high DR where not all the pixels in a given row are reset at the same time when the row is addressed. In the column reset sensor, architecture the reset signal is supplied to pixels via columns, not via rows. Only a single selected pixel of the array can be reset instead of an entire row.

The present invention addresses these difficulties of conventional BCMD pixel design, and provides a simpler and practical solution where the compact pixel size, the column reset capability, and other performance enhancing features are achieved. This is accomplished by forming a new BCMD device with a Dual Gate structure (DGBCMD).

SUMMARY OF THE INVENTION

The invention provides a practical, CMOS compatible, image sensor with image-sensing pixel design that has high performance, simple structure, compact size, anti-blooming protection, and column reset capability. By incorporating a dual gate MOS transistor with an enclosed annular layout into the pixels of image sensing array, and sensing photo-generated charge nondestructively by detecting the transistor threshold voltage variations caused by collected charge, achieves this goal and other objects of the invention. The described device belongs to a class of devices whose pixels sense charge nondestructively with a complete charge reset and consequently without kTC-reset noise.

BRIEF DESCRIPTION OF DRAWINGS

The invention will be described in detail in the following description of preferred embodiments with reference to the following figures wherein.

DETAIL DESCRIPTION OF PREFERRED EMBODIMENTS

Figure 1:
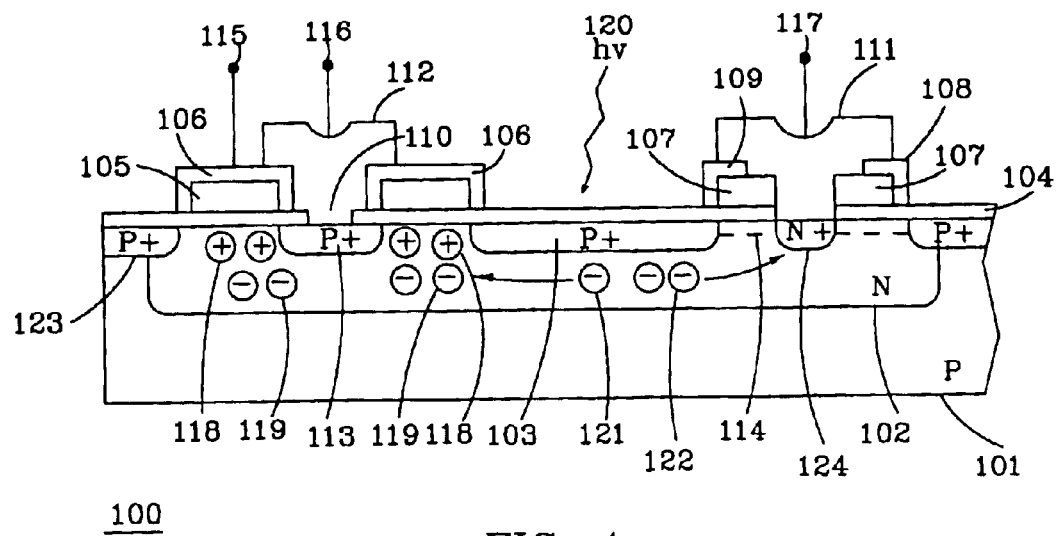
FIG. 1 shows the simplified drawing of a cross section of standard, prior art, BCMD image sensor pixel incorporating a buried, pinned, photodiode that has also a lateral anti-blooming drain used for complete reset without kTC reset noise generation.

In FIG. 1 the drawing 100 represents a cross section of the prior art BCMD pixel. P type substrate 101 has an n type layer 102, p+ type regions 103, 113, 123, and n+ type region 124 placed near its surface. Poly silicon gates 105 and 107 are placed on top of the substrate over insulating layer 104.

Insulating layers 106 and 108 are placed on top, and on the sidewalls of the poly silicon gates 105 and 107. Metal interconnect 112 is contacting p+ region 113 through opening 110, and interconnect 111 is contacting both the poly silicon gate 107 and n+ region 124 through opening 109.

The BCMD p channel MOS transistor device is formed by central p+ source 113, which is surrounded by annually shaped gate 105, and drains 123 and 103. Regions 123 and 103 actually form a single contiguous diffusion that completely surrounds gate 105. When the BCMD transistor is properly biased, hole current 118 flows from source 113 to drains 103/123. The transistor threshold is modulated by presence of electron charge 119 under the gate. The BCMD transistor can be biased either by a constant current source or by a constant voltage source. When biased by a constant current source, charge 119 is detected by measuring the potential of source 113. When biased by a constant voltage source, the present of charge is sensed by measuring hole current 118, flowing into source 113. Lines 116 and 117 indicate connections of the photocell to the appropriate biasing and sensing circuits located elsewhere on the chip. When light photons 120 enter the pinned photodiode, formed by p+ diffusion 103, they generate electrons 121. These are collected in a potential well under the BCMD transistor gate 105 and join electrons 119 already collected there to modulate the device potential or current. When too many electrons accumulate in the well, excess 122 overflows into the anti-blooming drain region that is formed under gate 107 by implants 114 and n+ diffusion 124. When proper biases are applied to gates 105 and 107, all charge can be emptied from the structure into the drain 124. This is called the complete charge reset and as a result no kTC-reset noise is generated. Charge can also be repeatedly sensed many times before reset. While the BCMD MOS transistor has a small size, the addition of the pinned photodiode region and the anti-blooming drain structure makes this pixel larger and less suitable for applications in high-resolution CMOS image sensors with very small pixel sizes.

Figure 2:
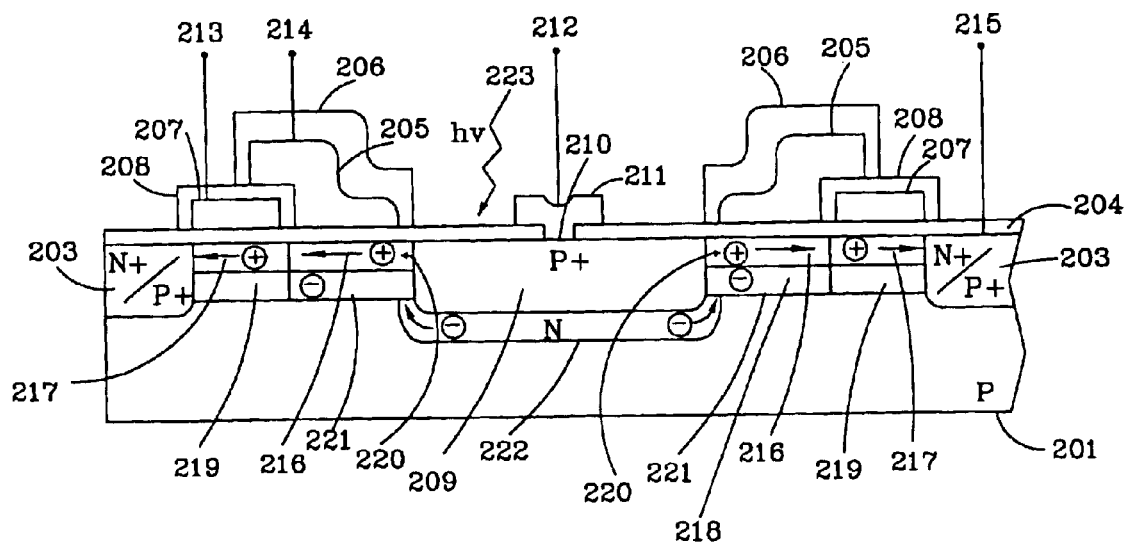
FIG. 2 shows a simplified drawing of a cross section of the device of present invention that has an annular shape including the central photo-sensing area, which is surrounded by an enclosed dual gate MOS transistor structure in which both types of p+ and n+MOS transistor drains are located alternately along the outside periphery of the MOS transistor gates.

The simplified drawing 200 in FIG. 2 represents a cross section of the device of present invention that has an annular shape, includes the central photo-sensing area, which is surrounded by an enclosed dual gate MOS transistor structure in which both types of p+ and n+ MOS transistor drains are located alternately along the outside periphery of the MOS transistor gates. P type substrate 201 has n+/p+ regions 203 and p+ region 209 located near its surface. Insulating layer 204 placed on top of the substrate separates poly-silicon gates 205 and 207 from the substrate. Another insulating layers 206 and 208 are placed on top and on the sidewalls of poly-silicon gates 205 and 207. Metal interconnect 211 is contacting region 209 through opening 210 in the oxide layer 204 to supply bias. Region 209 forms the source of the p channel MOS transistor, and is electrically isolated from the reset of the substrate 201 by n-type doped region 222. Gates 205 and 207 have an enclosed annual geometry and both surround the source. Both p+ and n+ drains 203 are placed around the outer periphery of the transistor gates as shown in more detail in FIG. 4. Various suitable p type implants 217 and 220 are placed near the substrate surface under the gates 205 and 207 and suitable n type implants 218 and 219 are placed deeper, preferably under the p type implants. The p type implants serve to shape the transistor potential profile to properly confine hole current 220, injected from source 209, while the n type doped regions are used to confine photo-generated electrons 221 in a potential well in such a way that they modulate the transistor potential profile, or the transistor hole current with high efficiency.

Similarly as in the previous case of BCMD device, the DGBCMD device can be biased either by a constant current source or by a constant voltage source. The biases are provided to the structure via connections 212, 213, 214, and 215. When photons 223 enter the photosensitive area of the pixel, they create electrons 202. Electrons flow into a potential well located in region 218 and join electrons 221 already collected there. When overflow or reset condition occurs, electrons flow through region 219 into n+ drain 203.

Figure 3:
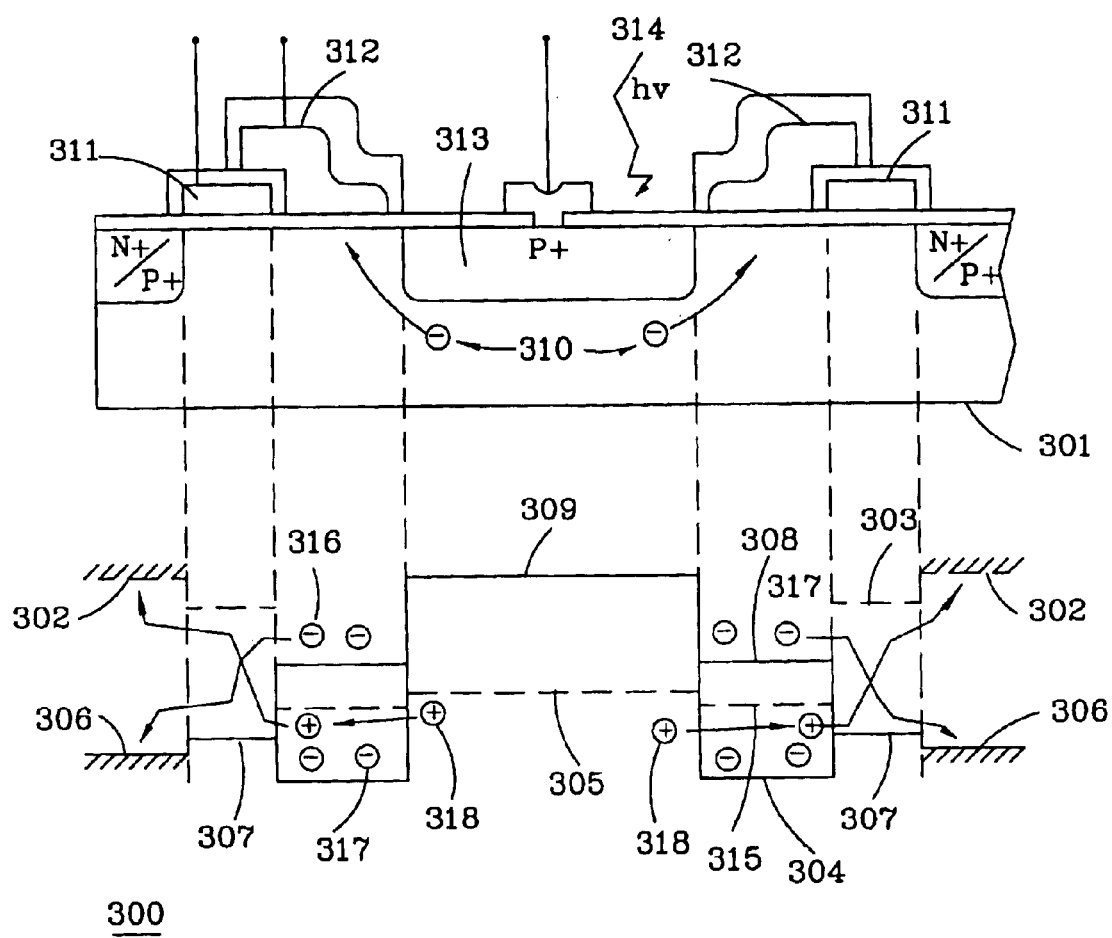
FIG. 3 is the simplified potential diagram of the invention for various biasing conditions that shows the flow of photo-generated electrons and injected holes within the structure.

For more clarity, a simplified potential profile of the DGBCMD device 301 along the transistor channel with the corresponding carrier flows is shown in drawing 300 in FIG. 3. The difference between potential of electrons and holes (band-gap) is for simplicity of drawing neglected, however, the difference between potential in silicon bulk and at the silicon—silicon dioxide interface is kept in the drawing at least for gate 312 (level 315). When gate 311 is biased low at level 303 and gate 312 biased high at level 304, holes 315 are injected from source 313 biased at level 305 and flow over barriers 315 and 303 to p+ drain biased at level 302. Hole current 318 can be measured or potential 305 sensed when the DGBCMD transistor is biased either by a constant voltage source or by a constant current source, respectively, as explained previously for BCMD device. Electrons 310 generated by photons 314 accumulate in a potential well at level 304 and modulate the hole current or source potential respectively. When sufficient electrons 317 accumulate in the well 304, the excess overflows over level 307 into n+ drain 306. This feature is called anti-blooming protection. This prevents spilling of charge from brightly illuminated pixels into neighboring pixels that may not be illuminated at all. Blooming is an unwanted phenomenon that leads to many unpleasant image artifacts and needs to be avoided in all modern image sensors. When it is necessary to reset collected charge, bias of source 301 is lowered to level 309, bias of gate 312 is lowered to level 308, and bias of gate 311 is raised to level 307 from level 303. Accumulated electrons 316 can now flow freely and unobstructed to n+drain biased at level 306. It is now easy to see that by suitable manipulation of biases applied to source 313, gate 311, and gate 312; it is possible to control the potential within the structure, and thus control the location and flow of holes and electrons in the structure independently. The exact pulse sequence that is applied to a CMOS sensor with DGBCMD photocells in its array during addressing, sensing, and reset time intervals is shown in more detail in FIG. 6.

Figure 4:
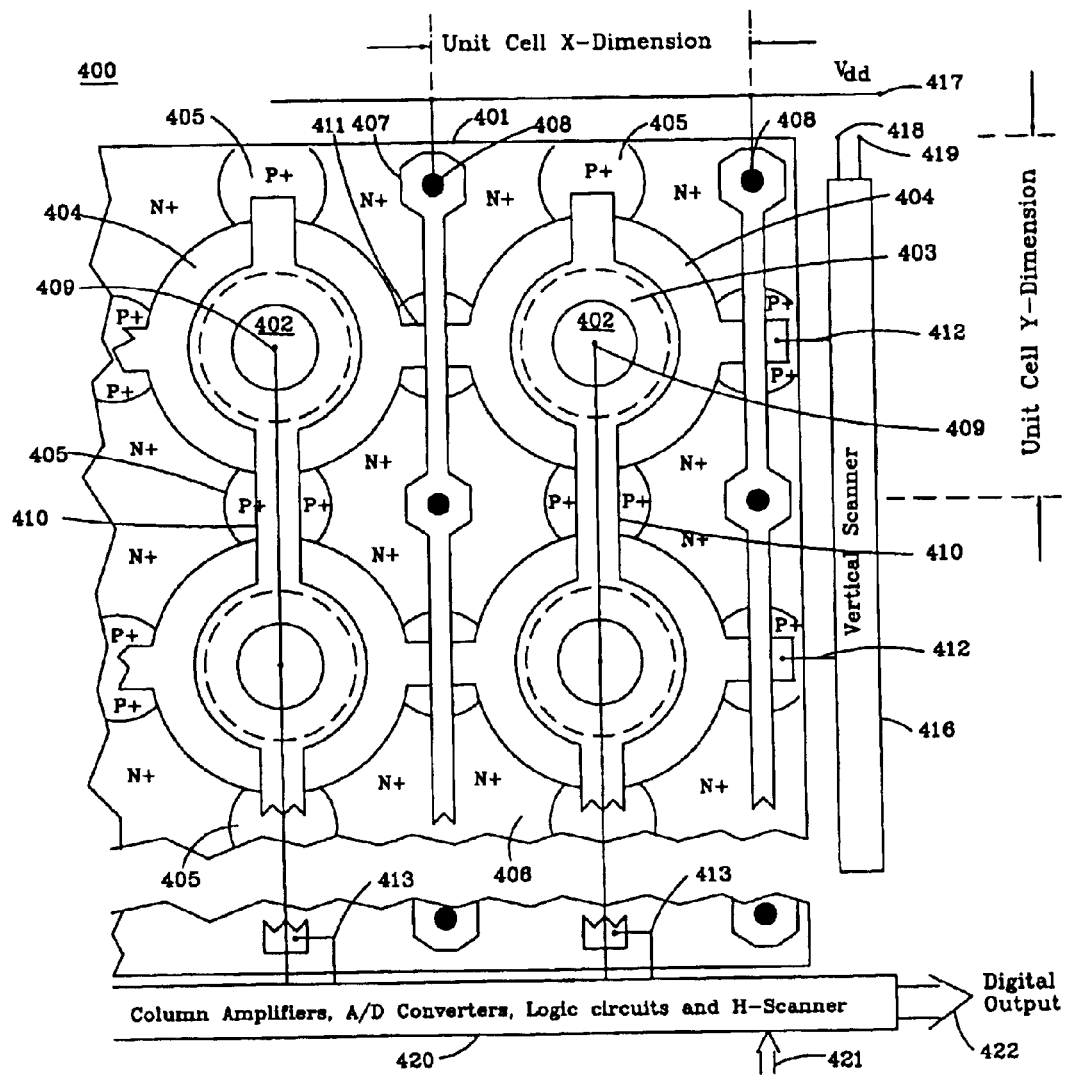
FIG. 4 represents an example of simplified layout of a CMOS image sensor array that incorporates the pixels of present invention.
Figure 5:
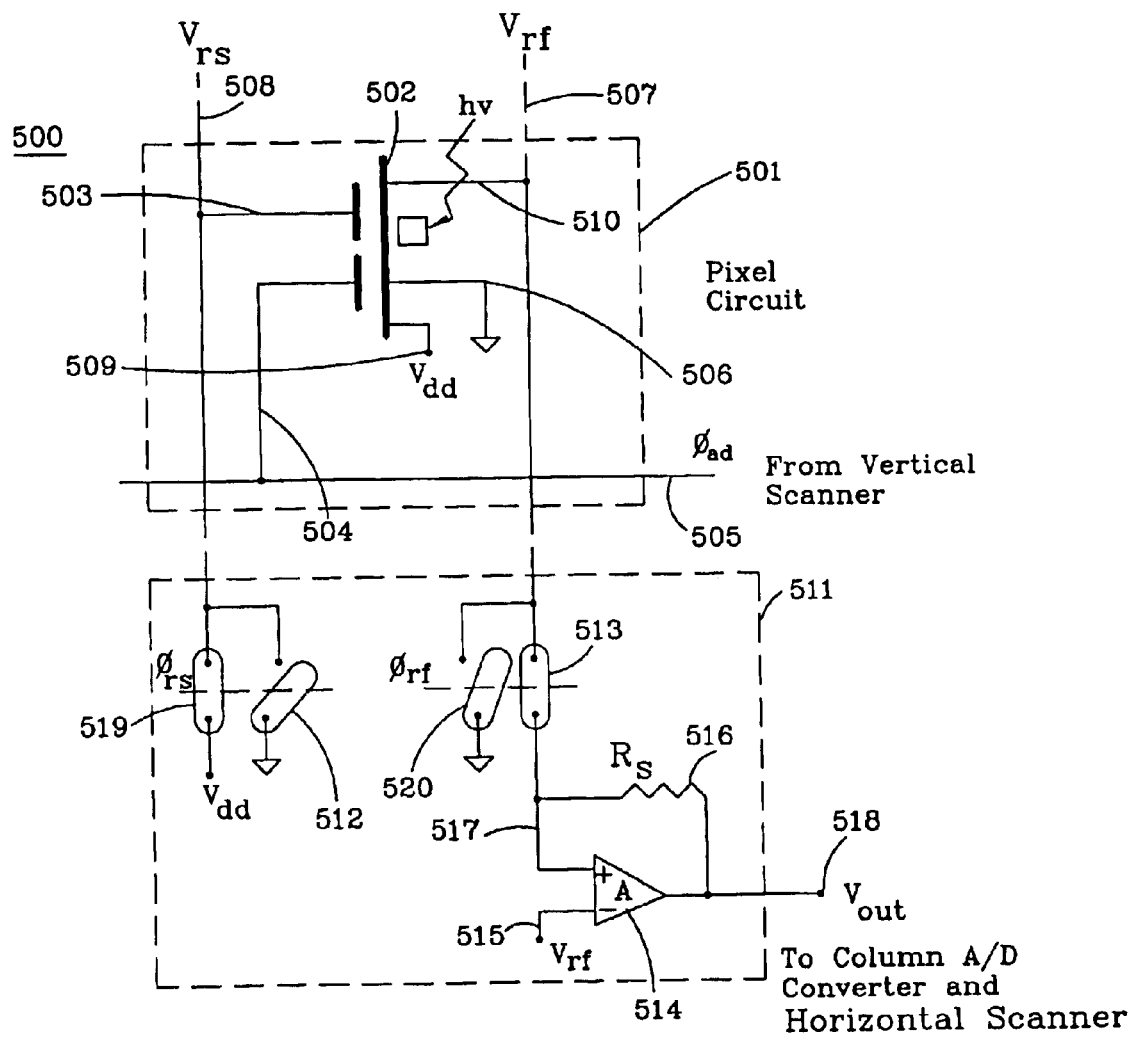
FIG. 5 represents a simplified circuit diagram of the pixel as used in the image-sensing array with a portion of the column signal processing and switching circuits shown in detail.

An example of a typical CMOS image sensor array layout that incorporates DGBCMD pixels is shown in drawing 400 in FIG. 4. For simplicity, the drawing shows only the upper right hand corner of the array with a 2×2 pixel sub-array. The metal wiring, the vertical scanning circuits, and the column amplifiers with other horizontal scanning and signal processing circuits are shown only in a block diagram form. The array consists of identical unit cells 401 that have photo-sensing region 402 in their center surrounded by gates 403 and 404. Gates 404 are all interconnected horizontally through straps 411 in a row and connected by wiring 412 to vertical addressing circuits 416 shown in the drawing only in a block diagram form. Applying appropriate clocking pulses to terminals 418 and 419 activates the row addressing circuits and selects the desired row for readout. Many types of CMOS circuits can be used in block 416, ranging from simple decoders to complicated bi-directional shift registers with digital word preloading capability. This is all well known to those skilled in the art, and is not discussed here in any further detail. Gates 402 are all interconnected vertically using column straps 410 and by wiring 413 connected to horizontal addressing and logic circuits 420 shown here again only in a block diagram form. Depending on the level of signal received from the selected row of pixels, the logic circuits determine if the particular pixel in the selected row needs to be reset or not. The resulting reset signal is then applied to the corresponding column via wiring 413, and some of the pixels are reset. A conventional wiring with all pixels reset simultaneously by rows is also possible for the DGBCMD pixels. In this case the straps 410 are connecting gates 404 in horizontal direction and corresponding reset circuits are incorporated into vertical scanner 416. Horizontal circuit block 420 also includes circuits for biasing of vertical column lines 409 that provide bias for the source regions 402 of each pixel. This block can also contain more complex circuits such as A/D converters or CDS circuits for elimination of transistor threshold non-uniformities as is well known to all those skilled in the art. The necessary logic and clocking pulses are applied to circuit block 420 via bus 421, and the output is available for further processing, or applying to the chip output terminals through bus 422. The detail of one simple example of biasing and sensing circuits used in block 420 is shown in FIG. 5. One important feature to note in drawing 400, however, is the location of n+ drain regions 406 and p+ drain regions 405. The drains are evenly dispersed around the outside periphery of each pixel gate 404. All n+ drain regions 406 are bussed together by metal wiring 407 that makes contact with the drains through contact holes 408. The bias voltage to each n+ drain is supplied from Vdd terminal 417. The p+ drain regions are biased vertically through the connection to chip substrate.

FIG. 5 shows simplified circuit schematic diagram 500 of DGBCMD pixel 501 as is used in a typical CMOS image-sensing array. Diagram 500 also shows a portion of the corresponding column sensing and switching circuit 511 that processes signal from the sense line and supplies reset to pixels via column line 508. Horizontal addressing line 505 supplies the necessary addressing bias to gate 504 that turns on transistor 502. As a result of applying address bias pulse to pixel current starts to flow through connection 510 from column sense line 507. In this example, the transistor is setup for reading current. Transistor 502 is connected to ground through connection 506, to Vdd through connection 504, and to column reset line 508 through connection 503. Column sensing and logic circuit 511 consist of switches 519 and 512 that generate a reset pulse, and switches 513 and 519 that control the bias on sense line 507. A conventional trans-impedance amplifier 514 senses current output from the pixel. Amplifier 514 is using feedback resistor 516, connected between nodes 517 and 518, for conversion of current into output voltage that finally appears on terminal 518. The analog output can be further processed in this circuit block by adding, for example, Analog-to-Digital (A/D) converter. A digital horizontal register then scans the digital output from all the columns, and the result is supplied to the output terminals of the sensor chip. This is a typical and conventional signal processing method frequently used in many CMOS image sensors that is well know to all those skilled in the art and, therefore, will not be discussed here in any further detail.

Figure 6:
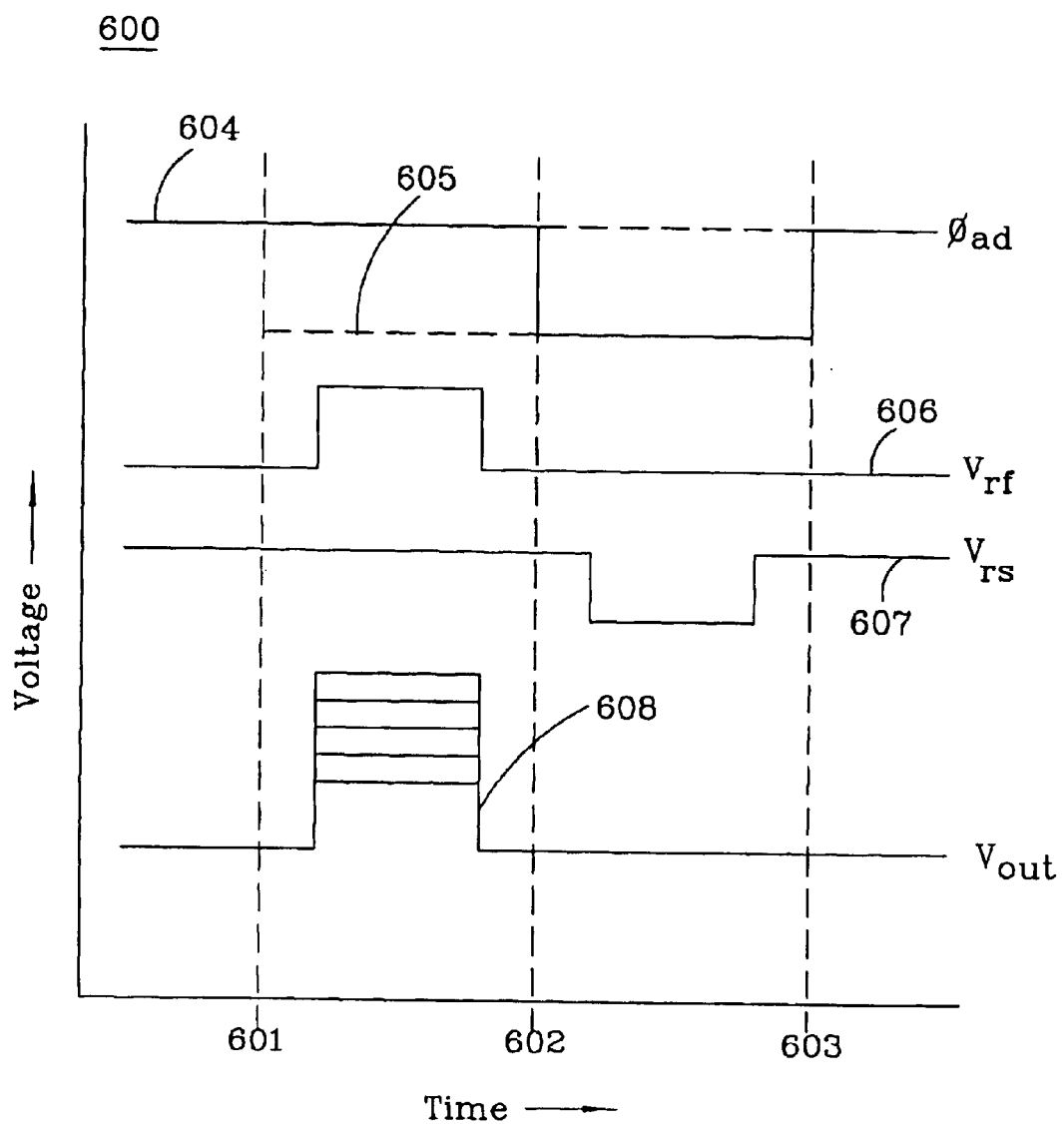
FIG. 6 represents a portion of the image sensor-timing diagram that is active during horizontal blanking interval and is used to read and reset charge signal in addressed pixels.

For completeness of description of DGBCMD pixel operation, timing diagram 600 is shown in FIG. 6. The diagram shows only a portion of the complete sensor timing, which is related to the operation of the pixel. Line 604 ($\Phi_{ad}$) represents the addressing pulses applied to the pixels of the array. During the readout interval, all the address lines stay at high bias level except for the selected line that is biased low at level 605. The transition to low state occurs at time 601. The readout cycle ends at time 602 and during this interval output signal 608 of various levels according to the amount of accumulated charge appears at the amplifier output terminal 518 (FIG. 5). The output is activated when pulse 606 ($V_{rf}$) is applied to line 507. In the next step, all the address lines are biased low except for the one whose pixels need to be reset. This is accomplished by applying pulse 607 ($V_{rs}$) to line 507. The pixel reset cycle ends at time 603 after which the original array biasing conditions are restored. Since not all the array column lines 507 had pulse 607 applied to them, only some of the pixels of the address line were reset. This is the key advantage of the column reset architecture that is used for extending the DR of the sensor.

Having described preferred embodiments of a novel CMOS image sensor concept that is using DGBCMD pixels that have a compact size, no kTC-reset noise generation, built in anti-blooming, and column reset capability, which are intended to be illustrative and not limiting, it is noted that persons skilled in the art can make modifications and variations in light of the above teachings. It is therefore to be understood that changes may be made in the particular embodiments of the invention disclosed, which are within the scope and spirit of the invention as defined by appended claims.

Having thus described the invention with the details and particularity required by the patent laws, what is claimed and desired protected by Letters Patent is set forth in the appended claims.

What is claimed is:

1. A CMOS image sensor arrays utilizing a Dual Gate BCMD pixel structure, comprising:

a substrate with a p-type region including a central p+ doped source region formed in a surface of the substrate;

an image sensor pixel within the p+ region;

at least two adjacent concentric conductive gate regions surrounding the P+ region forming at least a dual gate transistor gate structure separated from each other, and from said substrate by dielectrics layers grown and deposited on the substrate, and on the concentric conductive gate regions; and an n-type doped region electrically isolating the p+ region from the p-typed doped substrate.

2. The image array according to claim 1, wherein the at least two adjacent concentric conductive gate regions are surrounded by at least one of each p+ and n+ drain regions located around an outer periphery of the two concentric conductive gate regions, and within the substrate near its surface.

3. The image array according to claim 1, including p type and n type impurity doping under the at least two adjacent concentric conductive gate regions at predetermined depths within the substrate and near to its surface with p type impurity doping being closer to the surface and the n type impurity doping being placed deeper below the p type impurity doping.

4. The image array according to claim 1, including contact holes opened in the dielectrics layers and conductive metal lines formed over the opened holes to provide contact, and supply biases to device source, gates, and drains regions.

5. The image array according to claim 4, wherein the gate biases are adjustable so that photo generated charge, which overflow a collection region capacity, is moved into at lest one device drain without spilling over into a neighboring device region.

6. The image array according to claim 5, wherein the gate biases are adjustable so that a photo generated charge is completely removed into at least one device drain.

7. The image array according to claim 1, wherein pixels in a first concentric gate region of said at least two adjacent concentric gate regions are bussed in a horizontal direction for the purpose of row addressing, and pixels in a second concentric gate region of said at least two concentric adjacent gate regions are bussed in a horizontal direction for the purpose of providing simultaneous row reset.

8. The image array according to claim 7, wherein peripheral circuits are utilized to generate biases for the pixels and process signals from the pixels use standard CMOS circuits.

9. A CMOS image sensor array utilizing a Dual Gate BCMD pixel structure, comprising:

a substrate with a p-type region including a central p+ doped source region formed in a surface of the substrate;

an image sensor pixel within the p+ region;

first and second adjacent concentric conductive gate regions surrounding the P+ region and separated from each other, and from said substrate by dielectrics layers grown and deposited on the substrate, and on the adjacent concentric conductive gate regions; and an n-type doped region electrically isolating the p+ region from the p-typed doped substrate.

10. The device of claim 9, including device gate biases which are adjusted such that photo generated charge is completely removed into at least one of the device drains without generating kTC noise.

11. Image sensor array according to claim 9, wherein the first concentric gate regions of the pixels are bussed in a horizontal direction (rows) for the purpose of row addressing and the second concentric gate regions are bussed in a vertical direction columns for the purpose of providing column reset.

12. The image array according to claim 9, wherein the two adjacent concentric conductive gate regions are surrounded by at least one of each p+ and n+ drain regions located around an outer periphery of the two adjacent concentric conductive gate regions, and within the substrate near its surface.

13. The image array according to claim 9, including p type and n type impurity doping under the at least two adjacent concentric conductive gate regions at predetermined depths within the substrate and near to its surface with p type impurity doping being closer to the surface and the n type impurity doping being placed deeper below the p type impurity doping.

14. The image array according to claim 9, including contact holes opened in the dielectrics layers and conductive metal lines formed over the opened holes to provide contact, and supply biases to device source, gates, and drains regions.

15. The image array according to claim 14, wherein the gate biases are adjustable so that photo generated charge, which overflow a collection region capacity, is moved into at lest one device drain without spilling over into a neighboring device region.

16. The image array according to claim 15, wherein the gate biases are adjustable so that a photo generated charge is completely removed into at least one device drain.

* * * * *